(12) United States Patent
Ku et al.

(10) Patent No.: US 10,283,548 B1
(45) Date of Patent: May 7, 2019

(54) CMOS SENSORS AND METHODS OF FORMING THE SAME

(71) Applicant: Taiwan Semiconductor Manufacturing Co., Ltd., Hsinchu (TW)

(72) Inventors: Yu-Chien Ku, Tainan (TW); Huai-Jen Tung, Tainan (TW); Keng-Ying Liao, Tainan (TW); Yi-Hung Chen, Kaohsiung (TW); Shih-Hsun Hsu, New Taipei (TW); Yi-Fang Yang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/884,393

(22) Filed: Jan. 31, 2018

Related U.S. Application Data

(60) Provisional application No. 62/583,408, filed on Nov. 8, 2017.

(51) Int. Cl.
| | | |
|---|---|---|
| H01L 31/062 | (2012.01) | |
| H01L 31/113 | (2006.01) | |
| H01L 27/146 | (2006.01) | |
| H01L 23/00 | (2006.01) | |

(52) U.S. Cl.
CPC ........ *H01L 27/14636* (2013.01); *H01L 24/05* (2013.01); *H01L 27/14643* (2013.01); *H01L 2224/0214* (2013.01); *H01L 2224/0345* (2013.01); *H01L 2224/03831* (2013.01); *H01L 2224/0557* (2013.01); *H01L 2224/05559* (2013.01); *H01L 2224/05567* (2013.01); *H01L 2224/05571* (2013.01); *H01L 2224/05578* (2013.01)

(58) Field of Classification Search
CPC ......... H01L 27/14643; H01L 27/14636; H01L 27/14621; H01L 27/146; H01L 27/307
USPC ....................................................... 257/292
See application file for complete search history.

(56) References Cited

U.S. PATENT DOCUMENTS

| | | |
|---|---|---|
| 6,297,563 B1 | 10/2001 | Yamaha |
| 2005/0093176 A1 | 5/2005 | Hung |
| 2010/0155949 A1 | 6/2010 | Jain |

(Continued)

FOREIGN PATENT DOCUMENTS

TW    201737450    10/2017

OTHER PUBLICATIONS

"Office Action of Taiwan Counterpart Application," dated Jan. 9, 2019, p. 1-p. 5.

*Primary Examiner* — Theresa T Doan
(74) *Attorney, Agent, or Firm* — JCIPRNET

(57) ABSTRACT

CMOS sensors and methods of forming the same are disclosed. The CMOS sensor includes a semiconductor substrate, a dielectric layer, an interconnect, a bonding pad and a dummy pattern. The semiconductor substrate has a pixel region and a circuit region. The dielectric layer is surrounded by the semiconductor substrate in the circuit region. The interconnect is disposed over the dielectric layer in the circuit region. The bonding pad is disposed in the dielectric layer and electrically connects the interconnect in the circuit region. The dummy pattern is disposed in the dielectric layer and surrounds the bonding pad in the circuit region.

20 Claims, 4 Drawing Sheets

(56) References Cited

U.S. PATENT DOCUMENTS

| | | | |
|---|---|---|---|
| 2010/0187671 A1* | 7/2010 | Lin | H01L 21/76898 257/686 |
| 2012/0038020 A1 | 2/2012 | Lin | |
| 2013/0182162 A1* | 7/2013 | Hirayama | H01L 27/14603 348/302 |
| 2014/0308772 A1 | 10/2014 | Lin | |

* cited by examiner

CMOS SENSORS AND METHODS OF FORMING THE SAME

CROSS-REFERENCE TO RELATED APPLICATION

This application claims the priority benefit of U.S. provisional application Ser. No. 62/583,408, filed on Nov. 8, 2017. The entirety of the above-mentioned patent application is hereby incorporated by reference herein and made a part of this specification.

BACKGROUND

Image sensors are widely used in digital still cameras, cellular phones, security cameras, medical, automobile, and other applications. The technology used to manufacture image sensors, and in particular CMOS (complementary metal-oxide-semiconductor) image sensors, has continued to advance at a rapid pace. For example, the demands of higher resolution and lower power consumption have encouraged further miniaturization and integration of image sensors.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
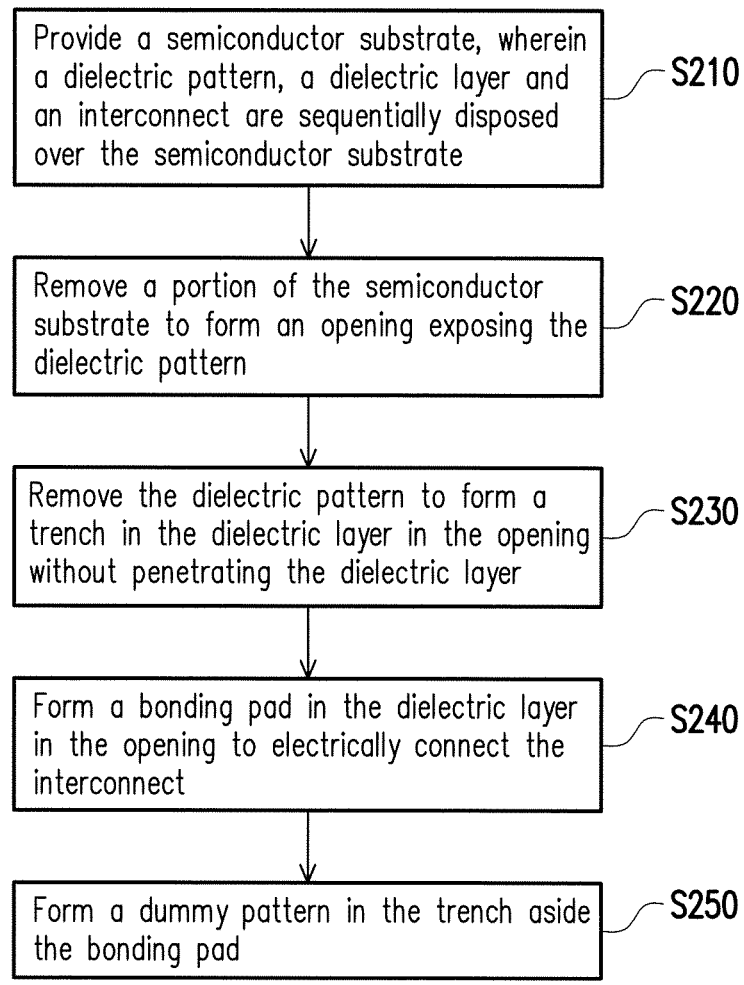
FIG. 1 is a flow chart of a method of forming a CMOS sensor in accordance with some embodiments of the disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method of forming a CMOS sensor in accordance with some embodiments of the disclosure. FIGS. 2A-2E are schematic cross-sectional views illustrating a method of forming a CMOS sensor in accordance with some embodiments of the disclosure. FIG. 3 is a schematic top view illustrating a dummy pattern and a bonding pad of a CMOS sensor in accordance with some embodiments of the disclosure.

Figure 2A:
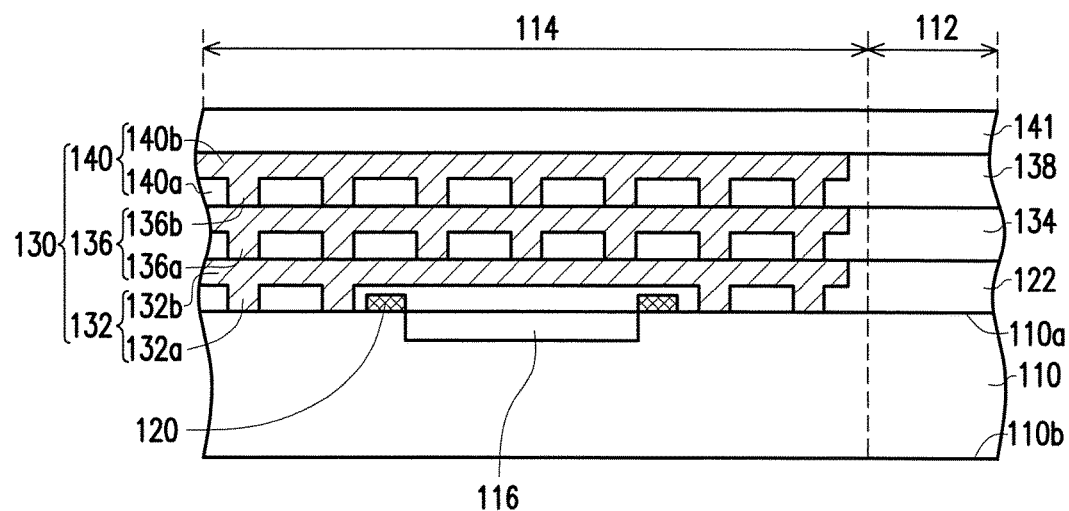
FIGS. 2A-2E are schematic cross-sectional views illustrating a method of forming a CMOS sensor in accordance with some embodiments of the disclosure.
Figure 3:
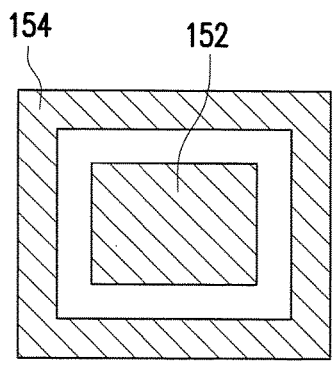
FIG. 3 is a schematic top view illustrating a dummy pattern and a bonding pad of a CMOS sensor in accordance with some embodiments of the disclosure.

Referring to FIGS. 1 and 2A, at step S210, a semiconductor substrate 110 is provided, and a dielectric pattern 120, a dielectric layer 122 and an interconnect 130 are sequentially disposed over the semiconductor substrate 110. The semiconductor substrate 110 includes a first surface 110a and a second surface 110b opposite to the first surface 110a. In some embodiments, the first surface 110a is a front side, and the second surface 110b is a back side, for example. The semiconductor substrate 110 has a pixel region 112 and a circuit region 114 aside the pixel region 112. The pixel region 112 is also an active region, and includes a plurality of image sensing units and phase detection units, for example. In some embodiments, the image sensing units and the phase detection units are formed through ion implantation on the first surface 110a of the semiconductor substrate 110. For example, the image sensing units and the phase detection units are photodiodes, wherein each of the photodiodes may include at least one p-type doped region, at least one n-type doped region, and a p-n junction formed between the p-type doped region and the n-type doped region. In detail, when the semiconductor substrate 110 is a p-type substrate, n-type dopants, such as phosphorous (P) or arsenic (As), may be doped into the pixel region 112 to form n-type wells, and the resulting p-n junctions in the pixel region 112 are able to perform the image sensing function and phase detection function. Similarly, when the semiconductor substrate 110 is an n-type substrate, p-type dopants, such as boron of $BF_2$, may be doped into the pixel region 112 to form p-type wells, and the resulting p-n junctions in the pixel region 112 are able to perform the image sensing function and phase detection function. Detailed descriptions of ion implantation processes for forming n-type doped regions (wells) or p-type doped regions (wells) are omitted herein. In some alternative embodiments, the image sensing units and the phase detection units may be other photoelectric elements capable of performing image sensing and phase detection function. When a reversed bias is applied to the p-n junctions of the image sensing units and the phase detection units, the p-n junctions are sensitive to an incident light. The light received or detected by the image sensing units and the phase detection units is converted into photo-current such that analog signal representing intensity of the photo-current is generated. The circuit region 114 is designate for receiving and processing signal originated from the image sensing units and the phase detection units. The circuit region 114, for example, includes conductive traces and NAND/NOR gates.

A material of the semiconductor substrate 110 includes a suitable elemental semiconductor, such as silicon, diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 110 may include silicon with p-type dopants such as phosphorous or arsenic. In some embodiments, the semiconductor substrate 110 has a thickness of about 1.5 µm to about 3 µm.

In some embodiments, an insulator 116 is formed in the semiconductor substrate 110 at the first side 110a. In other words, the insulator 116 is formed to be embedded in the semiconductor substrate 110. In some embodiments, the insulator 116 is a shallow trench isolation (STI) structure. However, the present disclosure is not limited thereto. The formation process of the insulator 116 (i.e. the STI structure) may be attained by the following steps. First, a shallow trench having a predetermined depth is formed in the semiconductor substrate 110 by photolithograph/etch process or other suitable patterning processes, for example. Next, a dielectric layer is deposited in the trench. Subsequently, a portion of the dielectric layer is removed (e.g., polishing, etching, or a combination thereof) to form the insulator 116 (i.e. the STI structure). A material of the insulator 116 (i.e. the STI structure) includes silicon oxide, silicon nitride, silicon oxynitride, other suitable materials, or a combination thereof. In some alternative embodiments, a variety of semiconductor elements such as n-type metal-oxide-semiconductor (MOS) transistors or/and p-type transistors are formed on the semiconductor substrate 110 in the circuit region 114.

In some embodiments, the dielectric pattern 120 is formed over the first side 110a of the semiconductor substrate 110 in the circuit region 114. The dielectric pattern 120 is formed to surround the insulator 116, for example. In some embodiments, the dielectric pattern 120 is ring-shaped. The ring-shaped may be a rectangle, a circle, an eclipse or other suitable shape. A material of the dielectric pattern 120 has an etching selectivity similar to the semiconductor substrate 110. In some embodiments, the material of the dielectric pattern 120 includes a silicon-based material such as poly-silicon. The dielectric pattern 120 may be formed by chemical vapor deposition (CVD) such as low pressure chemical vapor deposition (LPCVD), plasma enhanced chemical vapor deposition (PECVD), high density plasma chemical vapor deposition (HDPCVD), or atomic layer chemical vapor deposition (ALCVD) or other suitable methods.

After forming the dielectric pattern 120, the dielectric layer 122 is formed over the first side 110a of the semiconductor substrate 110 to cover the dielectric pattern 120 in the circuit region 114. In some embodiments, the dielectric layer 122 is formed in both of the circuit region 114 and the pixel region 112. In some embodiments, a material of the dielectric layer 122 has an etching characteristic different from the dielectric pattern 120 and the semiconductor substrate 110. A material of the dielectric layers 122 may be a low k dielectric material (having a k value less than 3.0) such as spin-on inorganic dielectrics, spin-on organic dielectrics, porous inorganic dielectric materials, porous organic dielectric materials, organic polymer or organic silica glass. For example, SiLK (k=2.7) or FLARE of a polyallyl ether (PAE) series material (k=2.8), Black Diamond (k=3.0~2.4), FSG (SiOF series material), HSQ (hydrogen silsesquioxane, k=2.8~3.0), MSQ (methyl silsesquioxane, k=2.5~2.7), porous HSQ, or porous MSQ material may be used. The dielectric layer 122 may be formed by CVD such as LPCVD, PECVD, HDPCVD, or ALCVD, spin coating, or other suitable methods.

The interconnect 130 is formed over the dielectric layer 122 in the circuit region 114. In some embodiments, the interconnect 130 may be a multi-layer interconnect, and includes conductive structures 132, 136, 140, for example. In some embodiments, the conductive structure 132 is formed over and in the dielectric layer 122. In some embodiments, a dual damascene structure with a via hole and a trench is formed by a series of photolithography and anisotropic etching. Next, a conductive material layer is plated on the dielectric layer 122 by electrochemical plating (ECP) or electroless plating. The conductive material layer is then planarized by chemical mechanical polishing (CMP) to form the conductive structure 132 including a conductive layer 132b and a contact via 132a. In some embodiments, the conductive structure 132 is electrically connected to at least one of the semiconductor elements. Then, a dielectric layer 134 is then formed on the dielectric layer 122 by CVD such as LPCVD, PECVD, HDPCVD or ALCVD or spin coating. The material of the dielectric layer 134 may be the same or different than that of the dielectric layer 122. A dual damascene structure is formed in the dielectric layer 134 using a series of photolithography and anisotropic etching. A conductive material layer is plated on the dielectric layer 134 followed by planarization of the conductive material layer to form a conductive layer 136b connected to the conductive layer 132b through a contact via 136a. A dielectric layer 138 is subsequently formed on the dielectric layer 134 by depositing a dielectric material by CVD or spin coating. A dual damascene structure is formed in the dielectric layer 138 using a series of photolithography and anisotropic etching. A conductive material layer is plated on the dielectric layer 138 followed by planarization of the conductive material layer to form a conductive layer 140b connected to the conductive layer 136b through a contact via 140a. Therefore, the multi-layer interconnect 130 including the contact via 132a, the conductive layer 132b, the contact via 136a, the conductive layer 136b, the contact via 140a, and the conductive layer 140b is inlaid in the dielectric layers 122, 134, 138. A material of the dielectric layers 134, 138 may be a low k dielectric material (having a k value less than 3.0) such as spin-on inorganic dielectrics, spin-on organic dielectrics, porous inorganic dielectric materials, porous organic dielectric materials, organic polymer or organic silica glass. For example, SiLK (k=2.7) or FLARE of a polyallyl ether (PAE) series material (k=2.8), Black Diamond (k=3.0~2.4), FSG (SiOF series material), HSQ (hydrogen silsesquioxane, k=2.8~3.0), MSQ (methyl silsesquioxane, k=2.5~2.7), porous HSQ, or porous MSQ material may be used. The dielectric layers 134, 138 may be formed by CVD such as LPCVD, PECVD, HDPCVD, or ALCVD, spin coating, or other suitable methods. In some embodiments, a passivation layer 141 is formed over the interconnect 130, for example.

Figure 2B:
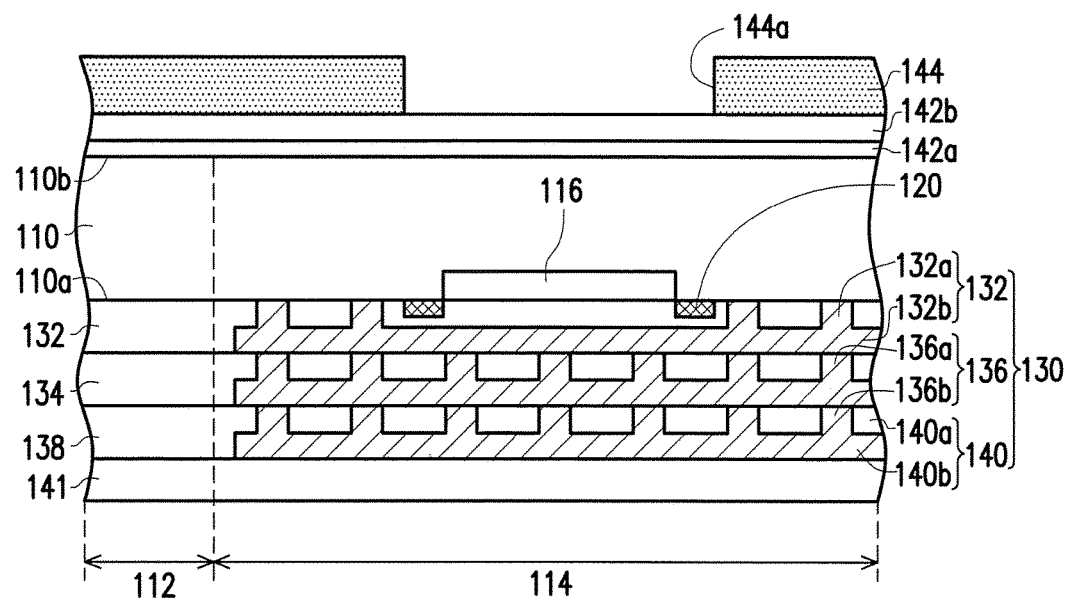
Figure 2C:
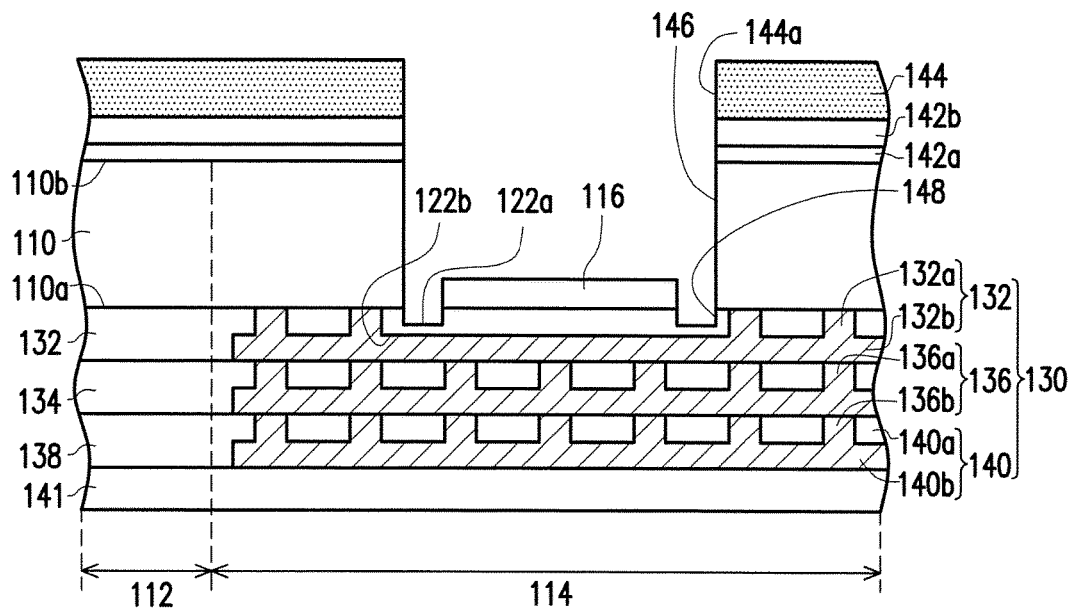

Referring to FIGS. 1, 2B and 2C, at steps S220 and S230, an opening 146 is formed in the semiconductor substrate 110 in the circuit region 114 by removing a portion of the semiconductor substrate 110, and a trench 148 is formed in the dielectric layer 122 by removing the dielectric pattern 120. In some embodiments, as shown in FIG. 2B, a structure of FIG. 2A is turned over, and a photoresist layer 144 is formed over the second surface 110b of the semiconductor substrate 110. The photoresist layer 144 is patterned and has an opening 144a over the insulator 116 and the dielectric pattern 120. A sidewall of the opening 144a is substantially aligned with an outer sidewall of the dielectric pattern 120, for example. The photoresist layer 144 is formed by photolithography including photoresist spin coating, soft baking, exposing, developing, and hard baking. In some embodiments, dielectric layers 142a, 142b may be formed between the photoresist layer 144 and the semiconductor substrate 110. Thus, the photoresist layer 144 is formed on the dielectric layer 142b, and the opening of the photoresist layer 144 exposes a portion of the dielectric layer 142b over the insulator 116 and the dielectric pattern 120. A material of the dielectric layers 142a, 142b has an etching characteristic different from the dielectric pattern 120 and similar to the semiconductor substrate 110. The dielectric layers 142a, 142b may be formed by CVD such as LPCVD, PECVD, HDPCVD, or ALCVD or other suitable methods.

As shown in FIG. 2C, in some embodiments, by using the photoresist layer 144 as an etch mask, portions of the semiconductor substrate 110 and the dielectric layers 142a, 142b are removed by an etching process until a top surface of the insulator 116 is exposed. In addition, since the material of the dielectric pattern 120 has an etching selectivity similar to the semiconductor substrate 110, during removal process of portions of the semiconductor substrate 110 and the dielectric layers 142a, 142b, the dielectric pattern 120 is simultaneously removed to form the trench 148 in the dielectric layer 122. In other words, the opening 146 has the trench 148 therein at the edge. In some embodiments, the portions of the semiconductor substrate 110 and the dielectric pattern 120 may be removed using a back side scribe line (BSSL) etch process or other etch process, for example. In some alternative embodiments, the dielectric pattern 120 may be removed by different etching process from the semiconductor substrate 110 and the dielectric layers 142a, 142b. Since the trench 148 is formed by removing the entire dielectric pattern 120, the profile of the trench 148 corresponds to the profile of the dielectric pattern 120, and a depth of the trench corresponds to a thickness of the dielectric pattern 120. In some embodiments, the trench 148 surrounds the insulator 116 and is ring-shaped, for example. The ring-shaped may be a rectangle, a circle, an eclipse or other suitable shape. The trench 148 is formed in the dielectric layer 122 without penetrating the dielectric layer 122. The trench 148 is disposed at a surface 122a of the dielectric layer 122, and the interconnect 130 is disposed at a surface 122b opposite to the surface 122a. In other words, the trench 148 and the interconnect 130 are disposed at opposite surfaces 122a, 122b of the dielectric layer 122.

A sidewall of the opening 146 is aligned with a sidewall (i.e., an outer sidewall) of the trench 148, and the trench 148 and the insulator 116 surrounded by the trench 148 are exposed through the opening 146. The opening 146 has dimensions of about 50 to 150 μm, and the trench 148 has dimensions of about 0.5 to 1 μm, for example. A depth of the trench 148 is about 20-30% of a thickness of the dielectric layer 122. For example, the depth of the trench 148 is about 800-1500 angstrom, and the thickness of the dielectric layer 122 is about 1000-3200 angstrom. A depth of the opening 146 at the edge is substantially equal to a total thickness of the dielectric layers 142a, 142b, the semiconductor substrate 110 and the dielectric pattern 120. The etching gas for the semiconductor substrate 110 and the dielectric pattern 120 may include hydrogen bromide (HBr) and oxygen, for example. After that, as shown in FIG. 2D, the photoresist layer 144 may be removed through, for example, a resist stripping process or a resist ashing process.

Figure 2D:
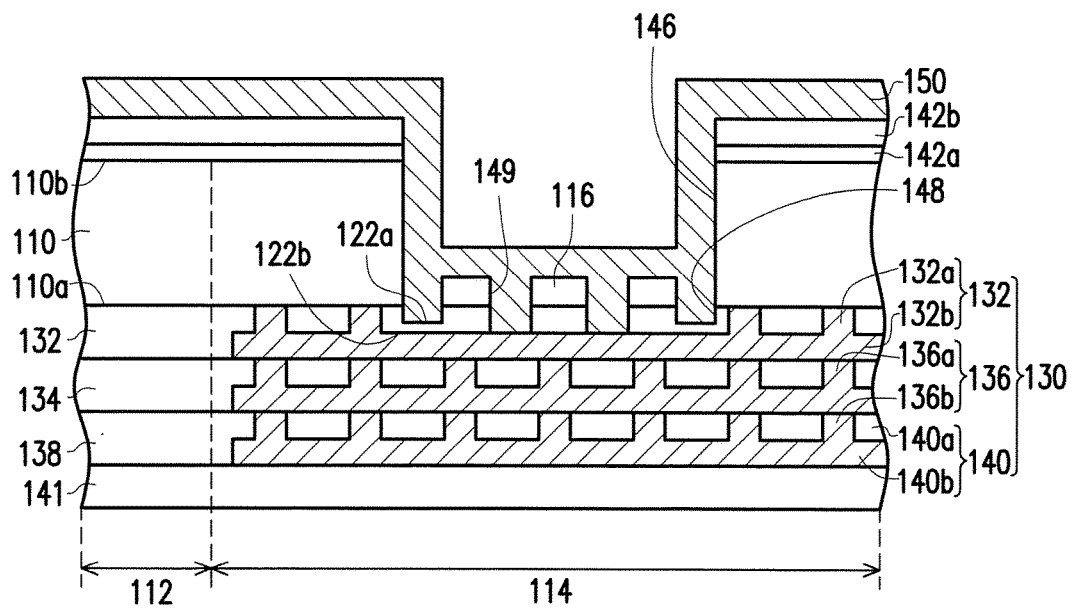
Figure 2E:
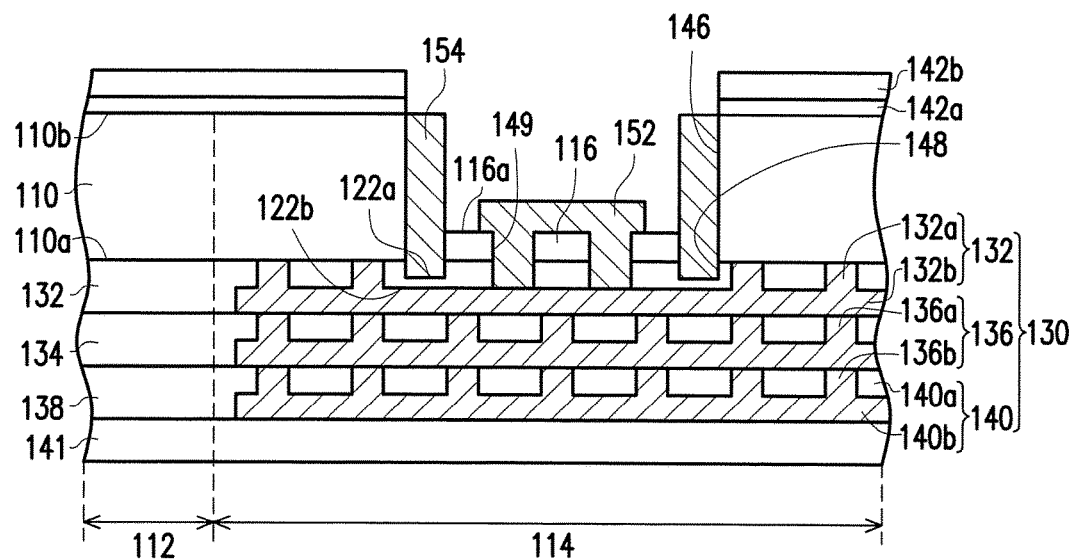

Referring to FIGS. 1, 2D and 2E, at steps S230 and S240, a bonding pad 152 is formed in a portion of the opening 146 to electrically connect the interconnect 130, and a dummy pattern 154 is formed in the trench 148 aside the bonding pad 152. In some embodiments, as shown in FIG. 2D, portions of the insulator 116 and the dielectric layer 122 are removed to form at least one opening 149 exposing a portion of the interconnect 130. Then, a conductive layer 150 is conformally formed on the dielectric layer 142b over the semiconductor substrate 110 and the top surfaces of the insulator 116 and the dielectric layer 122 including the trench 148. In addition, the conductive layer 150 is filled in the trench 148 and the opening 149. A method of forming the conductive layer 150 includes physical vapor deposition (PVD) or sputtering using a target including materials such as copper (Cu), aluminum (Al), aluminum-copper alloy or other suitable methods. In some alternative embodiments, the conductive layer 150 may further include seed layers, barrier layers, or combinations or multiple layers thereof.

After that, as shown in FIG. 2E, by using the dielectric layer 142b as an etch stop layer, portions of the conductive layer 150 outside the opening 146 and above an outer portion 116a of the insulator 116 are removed. Thus, the conductive layer 150 is divided into two parts in the opening 146, which are the bonding pad 152 and the dummy pattern 154 separated by the outer portion 116a the insulator 116 and the dielectric layer 122 therebeneath. A method of removing the portions of the conductive layer 150 includes an anisotropic etching process, for example. The portions of the conductive layer 150 disposed over the dielectric layer 142b and the outer portion 116a of the insulator 116 are vertically removed. The bonding pad 152 and the dummy pattern 154 are separated from each other by a distance which is equal to a width of the outer portion 116a of the insulator 116. A top surface of the dummy pattern 154 is higher than a top surface of the bonding pad 152 with respect to the second surface 122b of the dielectric layer 122. In some embodiments, the top surface of the dummy pattern 154 is substantially coplanar with a top surface of the semiconductor substrate 110, for example. The dummy pattern 154 is insulated from the interconnect 130 by the dielectric layer 122 disposed therebetween in a direction such as a vertical direction. The dummy pattern 154 is insulated from the bonding pad 152 by the dielectric layer 122 and the insulator 116 disposed therebetween in a direction such as a horizontal direction. In some embodiments, the bonding pad 152 is disposed in the opening 146 penetrating the semiconductor substrate 110, and thus the semiconductor substrate 110 is not disposed between the bonding pad 152 and the interconnect 130. A thickness of the dielectric layer 122 between the dummy pattern 154 and the interconnect 130 is smaller than a thickness of the dielectric layer 122 between the bonding pad 152 and the interconnect 130. A material of the dummy pattern 154 and a material of the bonding pad 152 are the same. The dummy pattern 154 is filled in the trench 148, and thus the dummy pattern 154 is also ring-shaped as shown in FIG. 3. The ring-shaped may be a rectangle, a circle, an eclipse or other suitable shape. In addition, the dummy pattern 154 inserted in the trench 148 is pin-liked.

In some alternative embodiments, a conductive material such as solder balls, microbumps, controlled collapse chip connection (C4) bumps, or a combination thereof may later be attached to the bonding pad 152 for electrical connection to the interconnect 130, for example. In some alternative embodiments, the CMOS image sensor may further include a first planarization layer on the semiconductor substrate 110, a color filter on the first planarization layer in the pixel region, a second planarization layer on the first planarization layer and color filter. The CMOS image sensor may further include a microlens on the second planarization layer, wherein the microlens is substantially aligned with the color filter. The CMOS image sensor may be a NIR (near-infrared) CMOS, for example.

In some embodiments, the bonding pad is surrounded by the dummy pattern, and the dummy pattern is disposed between the semiconductor substrate and the bonding pad in a direction such as a horizontal direction. In some embodiments, the dummy pattern is formed in the trench of the dielectric layer and in contact with a sidewall of the semiconductor substrate and sidewalls of the insulator and the dielectric layer beneath the insulator. In other words, the dummy pattern is disposed in a space between the sidewall of the semiconductor substrate and the sidewalls of the insulator and the dielectric layer beneath the insulator, and the dummy pattern is further inserted into the trench. Thus, the dummy pattern is substantially secured in the dielectric layer between the semiconductor substrate and the insulator and the dielectric layer beneath the insulator. Accordingly, the bonding pad is prevented from peeling from the sidewall of the semiconductor substrate.

In accordance with some embodiments of the disclosure, a CMOS sensor includes a semiconductor substrate, a dielectric layer, an interconnect, a bonding pad and a dummy pattern. The semiconductor substrate has a pixel region and a circuit region. The dielectric layer is surrounded by the semiconductor substrate in the circuit region. The interconnect is disposed over the dielectric layer in the circuit region. The bonding pad is disposed in the dielectric layer and electrically connects the interconnect in the circuit region. The dummy pattern is disposed in the dielectric layer and surrounds the bonding pad in the circuit region.

In accordance with alternative embodiments of the disclosure, a CMOS sensor includes a patterned semiconductor substrate, a patterned dielectric layer, an interconnect, a bonding pad and a dummy pattern. The patterned dielectric layer is exposed by the patterned semiconductor substrate and has at least one trench at a first surface thereof. The interconnect is disposed over a second surface opposite to the first surface of the patterned dielectric layer. The bonding pad is disposed over the first surface of the patterned dielectric layer and electrically connects the interconnect. The dummy pattern is disposed in the trench and aside the bonding pad.

In accordance with yet alternative embodiments of the disclosure, a method of forming a CMOS sensor includes the following steps. A semiconductor substrate having a pixel region and a circuit region is provided. A dielectric pattern is formed over the semiconductor substrate in the circuit region. A dielectric layer is formed over the semiconductor substrate to cover the dielectric pattern. An interconnect is formed over the dielectric layer in the circuit region. A portion of the semiconductor substrate is removed to form a first opening exposing the dielectric pattern. The dielectric pattern is removed to form a trench in the dielectric layer in the first opening. A bonding pad is formed in the dielectric layer in the first opening to electrically connect the interconnect. A dummy pattern is formed in the trench aside the bonding pad.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A CMOS sensor, comprising:
   a semiconductor substrate having a pixel region and a circuit region;
   a dielectric layer surrounded by the semiconductor substrate in the circuit region;
   an interconnect over the dielectric layer in the circuit region;
   a bonding pad disposed in the dielectric layer and electrically connecting the interconnect in the circuit region; and
   a dummy pattern disposed in the dielectric layer and surrounding the bonding pad in the circuit region, wherein a top surface of the dummy pattern is higher than a top surface of the bonding pad.

2. The CMOS sensor of claim 1, wherein the semiconductor substrate is not disposed between the bonding pad and the interconnect.

3. The CMOS sensor of claim 1, wherein the bonding pad and the dummy pattern are surrounded by the semiconductor substrate.

4. The CMOS sensor of claim 1, wherein the dummy pattern is disposed between the semiconductor substrate and the bonding pad.

5. The CMOS sensor of claim 1, wherein the dummy pattern is ring-shaped.

6. The CMOS sensor of claim 1, wherein a material of the dummy pattern and a material of the bonding pad are the same.

7. The CMOS sensor of claim 1, wherein the bonding pad and the dummy pattern are separated by a distance.

8. The CMOS sensor of claim 1, wherein the semiconductor substrate is in contact with the dummy pattern.

9. A CMOS sensor, comprising:
   a patterned semiconductor substrate;
   a patterned dielectric layer exposed by the patterned semiconductor substrate and having at least one trench at a first surface thereof;
   an interconnect disposed over a second surface opposite to the first surface of the patterned dielectric layer;
   a bonding pad disposed over the first surface of the patterned dielectric layer and electrically connecting the interconnect; and
   a dummy pattern, disposed in the trench and aside the bonding pad, wherein a thickness of the patterned dielectric layer between the dummy pattern and the interconnect is smaller than a thickness of the patterned dielectric layer between the bonding pad and the interconnect.

10. The CMOS sensor of claim 9 further comprising an insulator, wherein the insulator is disposed between the bonding pad and the patterned dielectric layer.

11. The CMOS sensor of claim 10, wherein the dummy pattern is disposed between and contact with sidewalls of the semiconductor substrate and the insulator.

12. The CMOS sensor of claim 9, wherein a top surface of the dummy pattern is higher than a top surface of the bonding pad with respect to the second surface.

13. The CMOS sensor of claim 9, wherein the trench does not penetrate the patterned dielectric layer.

14. The CMOS sensor of claim 9, wherein a material of the dummy pattern and a material of the bonding pad are the same.

15. A method of forming a CMOS sensor, comprising:
   providing a semiconductor substrate having a pixel region and a circuit region;

forming a dielectric pattern over the semiconductor substrate in the circuit region;
forming a dielectric layer over the semiconductor substrate to cover the dielectric pattern;
forming an interconnect over the dielectric layer in the circuit region;
removing a portion of the semiconductor substrate to form a first opening exposing the dielectric pattern;
removing the dielectric pattern to form a trench in the dielectric layer in the first opening without penetrating the dielectric layer;
forming a bonding pad in the dielectric layer in the first opening to electrically connect the interconnect; and
forming a dummy pattern in the trench aside the bonding pad, wherein a top surface of the dummy pattern is higher than a top surface of the bonding pad.

16. The method of claim 15, wherein the portion of the semiconductor substrate and the dielectric pattern are removed simultaneously.

17. The method of claim 15 further comprising forming at least one second opening in the dielectric layer to expose a portion of the interconnect before forming the bonding pad, wherein the bonding pad electrically connects the interconnect through the at least one second opening.

18. The method of claim 15, wherein forming the bonding pad and the dummy pattern comprises:
conformally forming a conductive layer over the semiconductor substrate; and
removing portions of the conductive layer to form the bonding pad and the dummy pattern separated from each other without extending outside the first opening.

19. The method of claim 18, wherein a method of removing portions of the conductive layer comprises an anisotropic etching process.

20. The method of claim 15, wherein sidewalls of the first opening and the trench are aligned.

* * * * *